United States Patent [19]
Lee

[11] Patent Number: 6,043,685
[45] Date of Patent: Mar. 28, 2000

[54] CIRCUIT FOR CONTROLLING SENSE AMPLIFIER OVER-DRIVING VOLTAGE

[75] Inventor: Jun-Pyo Lee, Cheongju, Rep. of Korea

[73] Assignee: LG Semicon Co., Ltd., Choongcheongbuk-Do, Rep. of Korea

[21] Appl. No.: 09/145,962

[22] Filed: Sep. 3, 1998

[30] Foreign Application Priority Data

Feb. 6, 1998 [KR] Rep. of Korea .................. 98/3403

[51] Int. Cl.⁷ ............................................... G01R 19/00
[52] U.S. Cl. ........................................... 327/52; 327/540
[58] Field of Search ................................. 327/51, 52, 53, 327/54, 55, 56, 57, 407, 408, 535, 537, 540, 541; 365/205, 189.11

[56] References Cited

U.S. PATENT DOCUMENTS 5,446,694   8/1995   Tanaka et al. ........................ 365/203
5,646,880   7/1997   Yuh ...................................... 365/149

OTHER PUBLICATIONS

IEEE International Solid–State Circuits Conference ISSCC95 Feb. 17, 1995 Buena Vista pp. 246–247.

*Primary Examiner*—Kenneth B. Wells
*Assistant Examiner*—Quan Tra

[57] ABSTRACT

A circuit for controlling a sense amplifier over-driving voltage includes a comparator for comparing an internal voltage and an over-driving voltage and a pumping circuit based on a sense amplifier circuit using an internal voltage and an over-driving voltage, so that it is possible to prevent an over-driving when a sense amplifier is operated by a low voltage when an external power voltage is decreased, and the over-driving voltage becomes identical with the internal voltage or lower than the same.

7 Claims, 2 Drawing Sheets

FIG. 1
BACKGROUND ART
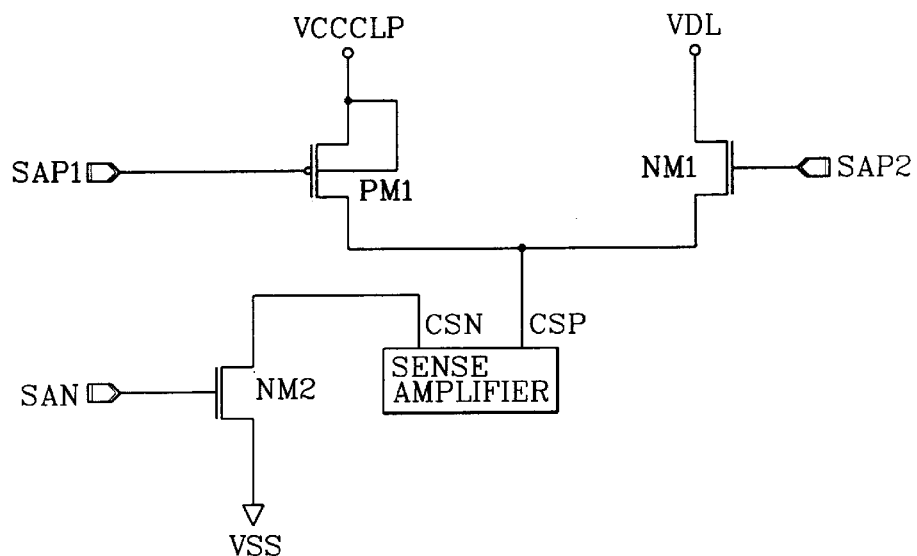
FIG. 2A SAN
BACKGROUND ART
FIG. 2B SAP1
BACKGROUND ART
FIG. 2C SAP2
BACKGROUND ART
FIG. 2D BL/BLB
BACKGROUND ART

CIRCUIT FOR CONTROLLING SENSE AMPLIFIER OVER-DRIVING VOLTAGE

BACKGROUND OF THE INVENTION

1. Field of the Invention

The present invention relates to a circuit for controlling a sense amplifier over-driving voltage, and in particular to an improved circuit for controlling a sense amplifier over-driving voltage which is capable of performing an over-driving operation of a normal sense amplifier when a DRAM is operated by a lower voltage.

2. Description of the Background Art

When an internal voltage VDL which is lower than an external power voltage VCC is used as a DRAM is operated by a lower voltage, a speed is decreased in the direction of a high voltage with respect to one of a pair of bit lines. In order to overcome the above-described problem, an over driving method is used, which is directed to operating a sense amplifier at an initial operation stage using an external power voltage VCC and operating the same using an internal voltage VDL after the initial operation stage.

As shown in FIG. 1, the known circuit for controlling a sense amplifier over-driving voltage includes a PMOS transistor PM1 the source of which receives an over-driving voltage VCCCLP, the gate of which receives a sense amplifier driving enable signal SAP1 in accordance with an over-driving voltage, and the source of which is connected with a substrate, an NMOS transistor NM1 the drain of which receives an internal voltage VDL, and the gate of which receives a sense amplifier driving enable signal SAP2 in accordance with the internal voltage, and an NMOS transistor NM2 the source of which is connected with a ground voltage VSS, the gate of which receives a sense amplifier driving enable signal SAN in accordance with a ground voltage VSS, and the drain of which is connected with a low level terminal of the sense amplifier, wherein the drain of the PMOS transistor PM1 and the source of the NMOS transistor NM1 are commonly connected with a high level terminal of the sense amplifier.

The operation of the known circuit of an over-driving voltage control will now be explained with reference to FIGS. 2A through 2D.

At the initial operation stage of the sense amplifier, a driving voltage CSP of the high level terminal of the sense amplifier is used as an over-driving voltage VCCCLP (about 3.3 V). The speed that the bit line BL or bit bar line BLB becomes a high level is controlled to be faster than the speed when the sense amplifier is driven by the internal voltage VDL (about 2.2 V).

If the voltage by which the bit line BL or bit bar line BLB becomes a high level exceeds an internal voltage VDL, the enable signal SAP2 is enabled for driving the sense amplifier by the internal voltage VDL, and the driving voltage CSP of the high level terminal of the sense amplifier is used as an internal voltage VDL.

At this time, if the bit line BL and bit bar line BLB are driven by the voltage exceeding the internal voltage VDL, a predetermined defect occurs in the cell for thereby decreasing the reliability of the product. Therefore, it is necessary to prevent the circuit from being driven by the voltage exceeding the internal voltage during the over-driving operation.

Therefore, since the sense amplifier is driven by the external power voltage VCC, the external power voltage VCC is decreased. In addition, when the over-driving voltage VCCCLP is used as a lower voltage (for example, below 2.2 V), it is impossible to obtain an over-driving effect.

SUMMARY OF THE INVENTION

Accordingly, it is an object of the present invention to provide a circuit for controlling a sense amplifier over-driving voltage which overcomes the aforementioned problems encountered in the background art.

It is another object of the present invention to provide a circuit for controlling a sense amplifier over-driving voltage which is capable of implementing an over-driving method when a sense amplifier is operated by a lower voltage.

To achieve the above objects, there is provided a circuit for controlling a sense amplifier over-driving voltage which includes a first switch for selectively supplying an internal voltage to a sense amplifier in accordance with a first control signal, a second switch for selectively supplying an over-driving voltage to the sense amplifier in accordance with a second control signal, a comparator for comparing the internal voltage and the over-driving voltage, and a pumping circuit for supplying an over-driving voltage to the sense amplifier.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a circuit diagram illustrating a known circuit for controlling a sense amplifier over-driving voltage;

FIGS. 2A through 2D are waveform diagrams illustrating operational timing of FIG. 1.

DETAILED DESCRIPTION OF THE PREFERRED EMBODIMENTS

Figure 3:
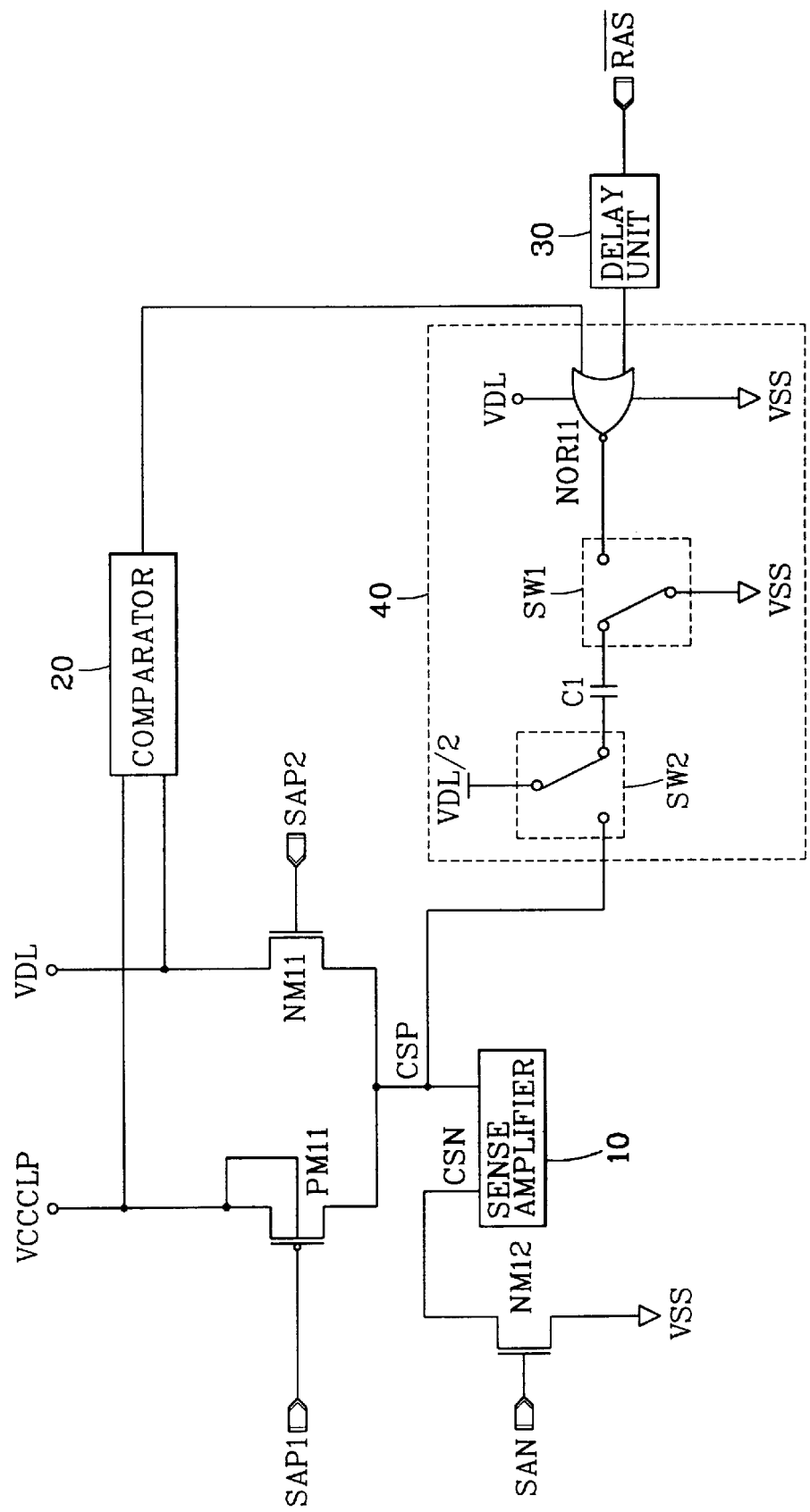
FIG. 3 is a circuit diagram illustrating a circuit for controlling a sense amplifier over-driving voltage.

As shown in FIG. 3, the circuit for controlling a sense amplifier over-driving voltage includes a PMOS transistor PM11 the source of which receives an over-driving voltage VCCCLP, the source of which is connected with a substrate, and the gate of which receives a sense amplifier driving enable signal SAP1, an NMOS transistor NM11 the drain of which receives an internal voltage VDL, and the gate of which receives a sense amplifier driving enable signal SAP2 in accordance with the internal voltage VDL, an NMOS transistor NM12 the source of which is connected with a ground voltage VSS, and the gate of which receives the sense amplifier driving enable signal SAN in accordance with the ground voltage VSS, a sense amplifier 10 a high level terminal of which is commonly connected with the drain of the PMOS transistor PM11 and the source of the NMOS transistor NM11 and a low level terminal of which is connected with the drain of the NMOS transistor NM12, a comparator 20 for comparing the over-driving voltage VCCCLP and the internal voltage VDL and outputting a result OVD of the comparison, a delay unit 30 for delaying an inverted signal of a RAS (Row Address Strobe Signal), and a pumping circuit 40 for receiving an inverter signal of the RAS signal RAS delayed by the delay unit 30 and an inverted signal of the comparison signal from the comparator 20 wherein the output terminal of the pumping circuit 40 is connected with the node with which the drain of the PMOS transistor PM11 and the source of the NMOS transistor NM11 are commonly connected.

Here, the pumping circuit 40 includes a NOR-gate NOR11 driven by the internal voltage VDL and receiving an inverted RAS signal delayed by the delay unit 30 and an inverted signal of the comparison signal from the comparator 20, a first three phase switch SW1 for selectively connecting an output signal from the NOR-gate NOR11 and the ground voltage VSS, a capacitor C1 for charging or discharging the ½ value of the internal voltage VDL, and a second three phase switch SW2 for charging the ½ value of the internal voltage VDL into the capacitor C1 and selectively switching the increase voltage (corresponding to the value obtained by adding the voltage VDL/2 charged into the capacitor C1 and the internal voltage VDL) to the high level terminal of the sense amplifier 10.

The operation of the circuit for controlling a sense amplifier over-driving voltage according to the present invention will now be explained with reference to the accompanying drawings.

First, if the over-driving voltage VCCCLP exceeds the internal voltage, the sense amplifier is operated identically to the known circuit.

However, if the over-driving voltage VCCCLP is decreased and becomes identical with the internal voltage VDL or lower than the same, the comparator 20 detects the thusly changed state and enables the inverted signal of the comparison signal OVD to a low level.

At this time, since the ½ value of the internal voltage VDL is charged into the capacitor C1 by the second three phase switch SW2, the inverted signal of the comparison signal OVD becomes a low level. The driving voltage CSP of the high level terminal of the sense amplifier 10 is increased up to the voltage (about 3.3 V) which is obtained by adding the internal voltage VDL and the voltage VDL/2 charged in the capacitor C1 and is pumped to the sense amplifier 10.

Thereafter, if the voltage by which the bit line or bit bar line becomes a high level exceeds the internal voltage VDL, the enable signal SAP2 is enabled for driving the sense amplifier based on the internal voltage VDL, so that the driving voltage CSP of the high level terminal of the sense amplifier is used as an internal voltage VDL.

As described above, in the present invention, it is possible to adapt an over-driving operation even when the sense amplifier is operated by the lower voltage when the external voltage VCC is decreased and becomes identical with the internal voltage VDL or lower than the same.

Although the preferred embodiment of the present invention have been disclosed for illustrative purposes, those skilled in the art still appreciate that various modifications, additions and substitutions are possible, without departing from the scope and spirit of the invention as recited in the accompanying claims.

What is claimed is:

1. A circuit for controlling a sense amplifier over-driving voltage, comprising:

a first switch for selectively supplying an internal voltage to a sense amplifier in accordance with a first control signal;

a second switch for selectively supplying an over-driving voltage to the sense amplifier in accordance with a second control signal;

a comparator for comparing the internal voltage and the over-driving voltage; and a pumping circuit for supplying said over-driving voltage to the sense amplifier.

2. The circuit of claim 1, wherein said pumping circuit includes:

a NOR-gate for NORing a comparison signal from the comparing means and an inverted signal of a RAS signal;

a third switch for selectively outputting an output signal from the NOR-gate and a ground voltage;

a capacitor selectively coupled to said third switch and a fourth switch, and said fourth switch means for charging a supply voltage into the capacitor or performing a pumping operation.

3. The circuit of claim 2, wherein said NOR-gate is driven by said internal voltage.

4. The circuit of claim 2, wherein said third switch is connected with said ground voltage at an initial stage and then is connected with an output terminal of the NOR-gate in accordance with a control signal.

5. The circuit of claim 2, wherein said fourth switch is connected with a supply voltage at an initial stage and then is connected with an output terminal in accordance with a control signal.

6. The circuit of claim 2, wherein said supply voltage is a voltage having a value of the internal voltage.

7. The circuit of claim 1, wherein said comparing means outputs a comparison signal having a high level when the internal voltage is higher than the over-driving voltage and output a comparison signal having a low level when the internal voltage is lower than the over-driving voltage.

* * * * *